(12) United States Patent
Kawa et al.

(10) Patent No.: US 9,857,409 B2
(45) Date of Patent: Jan. 2, 2018

(54) NEGATIVE BIAS THERMAL INSTABILITY STRESS TESTING OF TRANSISTORS

(71) Applicant: Synopsys, Inc., Mountain View, CA (US)

(72) Inventors: Jamil Kawa, Campbell, CA (US); Tzong-Kwang Henry Yeh, Los Gatos, CA (US); Shih-Yao Christine Sun, San Jose, CA (US); Raymond Tak-Hoi Leung, Palo Alto, CA (US)

(73) Assignee: Synopsys, Inc., Mountain View, CA (US)

( * ) Notice: Subject to any disclaimer, the term of this patent is extended or adjusted under 35 U.S.C. 154(b) by 194 days.

(21) Appl. No.: 14/461,327

(22) Filed: Aug. 15, 2014

(65) Prior Publication Data

US 2015/0061726 A1 Mar. 5, 2015

Related U.S. Application Data

(60) Provisional application No. 61/870,770, filed on Aug. 27, 2013.

(51) Int. Cl.
*G01R 31/26* (2014.01)

(52) U.S. Cl.
CPC ..... *G01R 31/2621* (2013.01); *G01R 31/2642* (2013.01); *G01R 31/2628* (2013.01)

(58) Field of Classification Search
CPC .......................... G01R 31/26; G01R 31/2621; G01R 31/2628; G01R 31/2642; G01R 31/2855; G01R 31/2849; G01R 11/465
See application file for complete search history.

(56) References Cited

U.S. PATENT DOCUMENTS

| | | | |
|---|---|---|---|
| 6,693,838 B2 | 2/2004 | Hagura et al. | |
| 7,379,339 B2 | 5/2008 | Paparisto et al. | |
| 7,409,305 B1 | 8/2008 | Carpenter et al. | |
| 7,447,054 B2 | 11/2008 | Abella et al. | |
| 7,483,322 B2 | 1/2009 | Joshi et al. | |
| 7,518,927 B2 | 4/2009 | Chung et al. | |
| 7,626,852 B2 | 12/2009 | Houston | |
| 7,675,781 B2 | 3/2010 | Deml et al. | |
| 8,947,911 B1 | 2/2015 | Chen | |
| 9,082,514 B1 | 7/2015 | Trimberger | |
| 2005/0138581 A1* | 6/2005 | Usui .................. | G06F 17/5036 716/136 |
| 2005/0146965 A1 | 7/2005 | Kim et al. | |

(Continued)

OTHER PUBLICATIONS

J. Baker "CMOS Circuit Design, Layout and Simulation", IEEE press, 1998, p. 96, equation 5.39.

(Continued)

*Primary Examiner* — Son Le
(74) *Attorney, Agent, or Firm* — HIPLegal LLP; Judith Szepesi

(57) ABSTRACT

A circuit is powered through a P-type transistor whose thermal instability behavior is to be evaluated. The threshold of the P-type transistor under evaluation and consequently the saturation current of the transistor are reflected in the frequency of the circuit, which in one embodiment is a ring oscillator. Additional circuitry is connected to the P-type transistor and the ring oscillator to ensure the proper stress conditions for the transistor and consequently to the evaluation of the P-type transistor.

18 Claims, 7 Drawing Sheets

(56) References Cited

U.S. PATENT DOCUMENTS

| | | |
|---|---|---|
| 2005/0212543 A1 | 9/2005 | Suzuki |
| 2005/0278677 A1 | 12/2005 | Ang et al. |
| 2006/0049842 A1 | 3/2006 | Krishnan et al. |
| 2006/0076972 A1 | 4/2006 | Walker et al. |
| 2006/0198226 A1 | 9/2006 | Takahashi et al. |
| 2006/0267621 A1 | 11/2006 | Harris et al. |
| 2007/0103242 A1 | 5/2007 | Wu |
| 2007/0237013 A1 | 10/2007 | Ng et al. |
| 2010/0038683 A1 | 2/2010 | Shanware et al. |
| 2010/0296329 A1 | 11/2010 | Summerfelt et al. |
| 2010/0322026 A1 | 12/2010 | Jain et al. |
| 2013/0015876 A1* | 1/2013 | Lai .................... G01R 31/2642 324/762.01 |
| 2013/0039139 A1 | 2/2013 | Raval et al. |
| 2013/0176767 A1 | 7/2013 | Brooks |
| 2014/0129884 A1 | 5/2014 | Hess et al. |
| 2015/0063010 A1 | 3/2015 | Kawa et al. |
| 2015/0086775 A1 | 3/2015 | Allen et al. |
| 2015/0228357 A1 | 8/2015 | Arsovski et al. |

OTHER PUBLICATIONS

J. Tsai, et al., "SRAM Stability Characterization Using Tunable Oscillators in 45nm CMOS", Solid-State Circuits conference Digest of Technical Papers (ISSCC), 2010 IEEE International /Session 19/High-Performance Embedded Memory/19.7, Feb. 7, 2010, pp. 354-355.

Z. Guo, et al., "Large-Scale Sram Variability Characterization in 45 nm CMOS SRAM Arrays," Symposium on VLSI Circuits, Jun. 2008, pp. 42-43.

Chan Tuck Boon, "Introduction on NBTI", Electrical Engineering, UCLA (Oct. 9, 2010) downloaded from: nanocad.ee.ucla.edu/pub/Main/SnippetTutoria1/05Oct-NBTI_intro.pdf on Sep. 14, 2015.

* cited by examiner

NEGATIVE BIAS THERMAL INSTABILITY STRESS TESTING OF TRANSISTORS

RELATED APPLICATIONS

The present application claims priority to U.S. Provisional Patent No. 61/870,770, filed on Aug. 27, 2013, and incorporates that application by reference in its entirety.

FIELD

The present invention relates generally to Negative Bias Thermal Instability (NBTI) evaluation of CMOS transistors and circuits.

BACKGROUND

CMOS semiconductor transistors, both P-type and N-type, are identified with two parameters, namely their threshold voltage—the voltage needed between the gate of a transistor and its source to turn it on—and their saturation current as a reflection of their drive strength. These two transistor parameters, the threshold voltage and the saturation current, are reflected in the speed of circuits in which such transistors are used as basic components.

CMOS transistors, P-type and N-type undergo a change—degradation—in their threshold voltage and saturation current over time. This degradation in the threshold voltage and saturation current of a transistor takes the form of an increase in the magnitude of the threshold voltage and a decrease in the magnitude of the saturation current. There are several physics based phenomena that cause such degradation.

One phenomenon is elevated electric fields between the gate of the transistor and its drain, known as hot carrier injection (HCI) resulting in a permanent shift in threshold voltage. Another phenomenon is "biased thermal instability" (BTI) that causes partially recoverable degradation in the threshold voltage of the transistor. BTI is highly dependent on temperature, total switching time, and the switching behavior of the transistor also known as the switching duty cycle. The BTI-induced change in the threshold voltage and saturation current of P-transistors is referred to as "negative bias thermal instability" (NBTI).

The NBTI phenomenon is a partially reversible process. When the applied source-to-gate bias is removed, the transistor is capable of recovering part of the change in threshold voltage and in saturation current brought about by the applied bias. The amount of recovery is heavily dependent on the duration of the absence of any source-to-gate bias. However, a partial recovery is usually fast.

Modeling NBTI is important for accurate circuit simulation. Because of the partial recovery aspect of NBTI, accurate modeling is heavily dependent on minimizing the amount of time between the application of the source-to-gate bias and the measurement of the magnitude of change in the threshold voltage and saturation current.

FIG. 1 illustrates a standard NBTI test setup representing the current state of the art. A bench tester 10 applies an external voltage bias of zero volts to the gate of the transistor P10 and measures the current flowing through the transistor. Then the P-transistor P10 is stressed through applying a stress voltage Vg at the gate of the transistor P10 and through applying a voltage Vdd, equal to the source voltage of P10, the drain of the transistor P10 to keep the potential between the source and the drain of P10 at zero during the stress phase of the test as shown in waveform 20. After the stress period is complete, the tester 10 releases the applied voltages to the gate and drain of transistor P10 and re-applies a bias of zero volts to the gate of the transistor P10. The tester then measures the new value of the current flowing through the transistor. There is usually a delay between the stress phase and the measurement phase determined by the tester limitations and specifications. During this delay, the transistor partially recovers from the NBTI effects. Thus the measured NBTI effect is lower than the actual NBTI effect.

BRIEF DESCRIPTION OF THE FIGURES

The present invention is illustrated by way of example, and not by way of limitation, in the figures of the accompanying drawings. The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DETAILED DESCRIPTION

Figure 1:
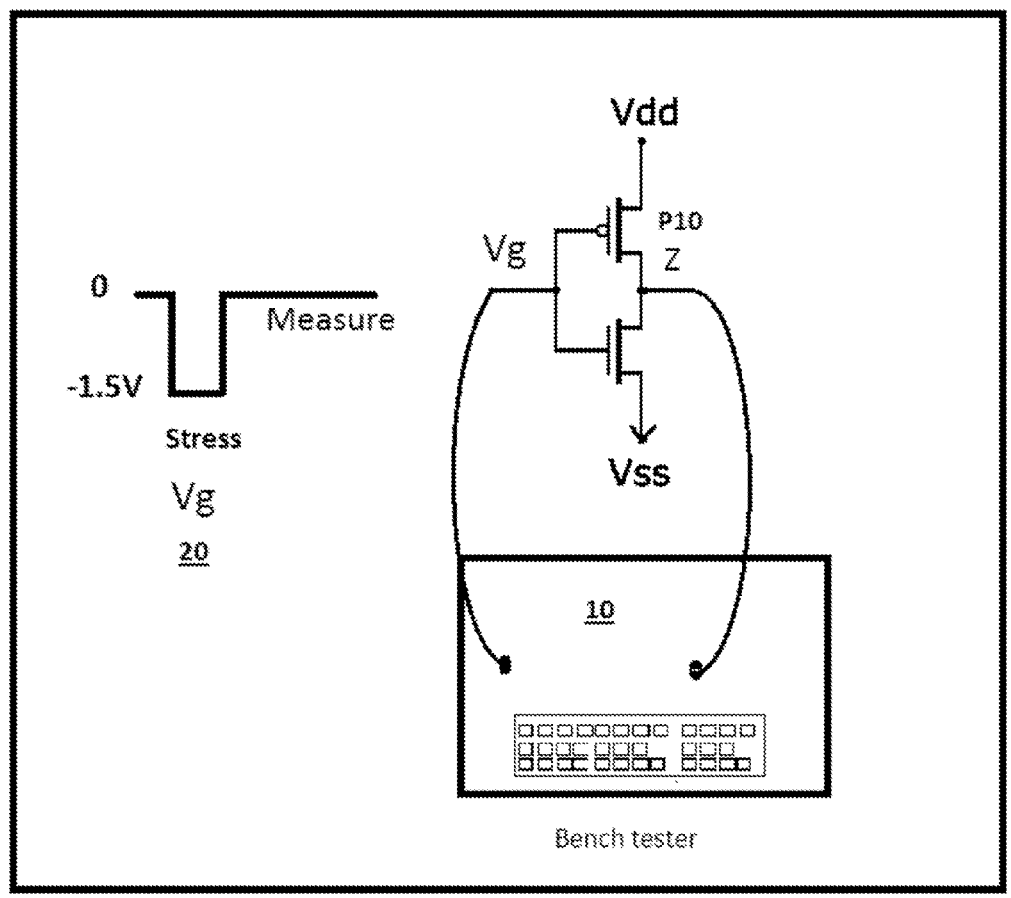
FIG. 1 is a diagram of a classical setup (prior art) for measuring NBTI using a tester/bench set-up.

The objective of this invention is to accurately determine the change in a transistor threshold voltage and saturation current resulting from as "negative bias thermal instability" (NBTI) based on an improved NBTI test. In one embodiment, the testing is for P-type transistors in a CMOS (complementary metal-oxide) circuit.

The system in one embodiment includes a circuit comprising a transistor for testing, the transistor having a gate-to source voltage Vgs and a drain-to-source voltage Vds, a sensor circuit connected to the drain of the transistor, a complementary control circuitry coupled to the transistor and the sensor circuit. The circuit is set up so the sensor circuitry is powered off during a stress phase of a stress test of the transistor, and the voltage between the source and drain of the transistor (Vds) is at or near zero during the stress test. The complementary control circuitry is designed to ensure that the sensor circuit is powered through the transistor during an evaluation phase of the stress test.

In one embodiment, the circuit consists of a sensor circuit driven by a transistor under evaluation. In one embodiment, the circuit may include additional circuit elements ensuring the proper conduction of the stress and evaluation phases of the transistor. In one embodiment, the circuit has three components:

1) The transistor to be stressed and then evaluated. In one embodiment, the transistor is a P-type transistor;

2) A sensor circuit that is driven directly or indirectly by the P-transistor under evaluation and that is powered during the evaluation phase only; and 3) Control logic that insures that during the stress phase the voltage across the source and drain of the transistor is zero, or small enough to make sure that no HCI component of degradation takes place interfering with the objective of evaluating NBTI, and that the sensor circuit is powered down during the stress phase to make sure the transistors of the sensor circuit do not undergo degradation.

The foregoing and other objectives, features, and advantages of the invention will be apparent from the following, more particular description of the preferred embodiment of the invention, as illustrated in the accompanying drawings.

The test circuit for evaluating the Negative Bias Thermal Instability (NBTI) of a P-type transistor is described. The circuits and methods described provide flexible and accurate measurement of threshold voltage and of saturation current degradation caused by NBTI. A sequence of stressing the P-transistor by applying a stress voltage to the gate of the transistor with respect to its source while maintaining a zero potential between the source and drain of the P-transistor under stress ensures that NBTI is the only physical phenomenon undergone by the transistor.

Also, the test circuit is set up so that the ring oscillator is not powered during stress to ensure that the transistors making up the oscillator are not undergoing stress and degradation and are preserved for accurate evaluation. The circuit controls the supply of power through the P-transistor to the ring oscillator simultaneously with the removal of the stress from the gate of the P-transistor being evaluated. The frequency of the oscillator is then captured through a tester or a counter. The method of registering the frequency of the ring oscillator is not specified as it is a well-known in the art.

Figure 2:
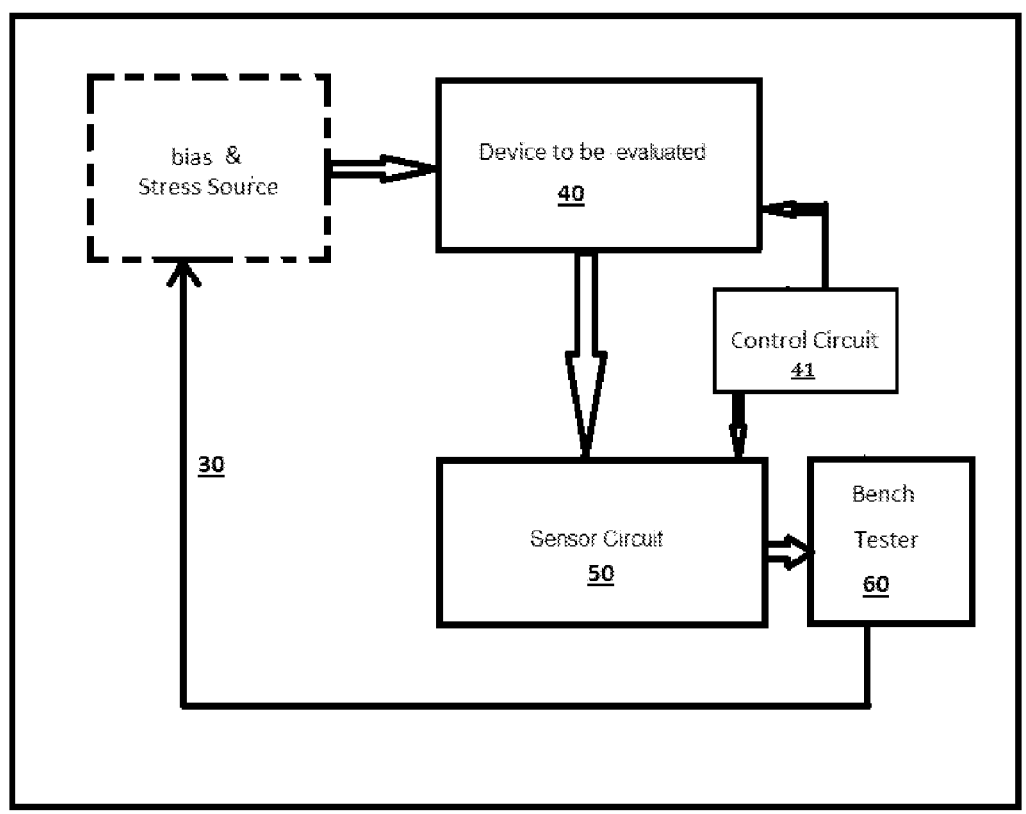
FIG. 2 is a block diagram of one embodiment of a circuit for fast and accurate thermal instability stress testing and evaluation.

Referring now to FIG. 2, a block diagram of a system for performing the fast and accurate evaluation of NBTI is depicted. Control signals 30 from the bench tester 60 are applied to the P-transistor to be evaluated as a fresh device, then to be stressed, then to be evaluated after stress. Bias & stress source 35 is a subset of the bench tester 60 in one embodiment. Device 40 is the P-transistor to be stressed and evaluated. Complementary control circuitry 41 is the control circuitry ensuring the proper bias and control conditions for the P-transistor under evaluation and of the sensor circuit 50 driven through the P-transistor.

In one embodiment, sensor circuit 50 is powered through the P-transistor 40 under evaluation and controlled by the complementary control circuit 41 to ensure no power is delivered from the P-transistor 40 to the sensor circuit 50 during the stress phase. Tester 60 provides supply voltages to the biased nodes of the P-transistor 40 and complementary control circuit 41, and sensors to read out the sensor circuit 50 frequency or the count of any counter included in the circuitry to measure the oscillator frequency.

Figure 3:
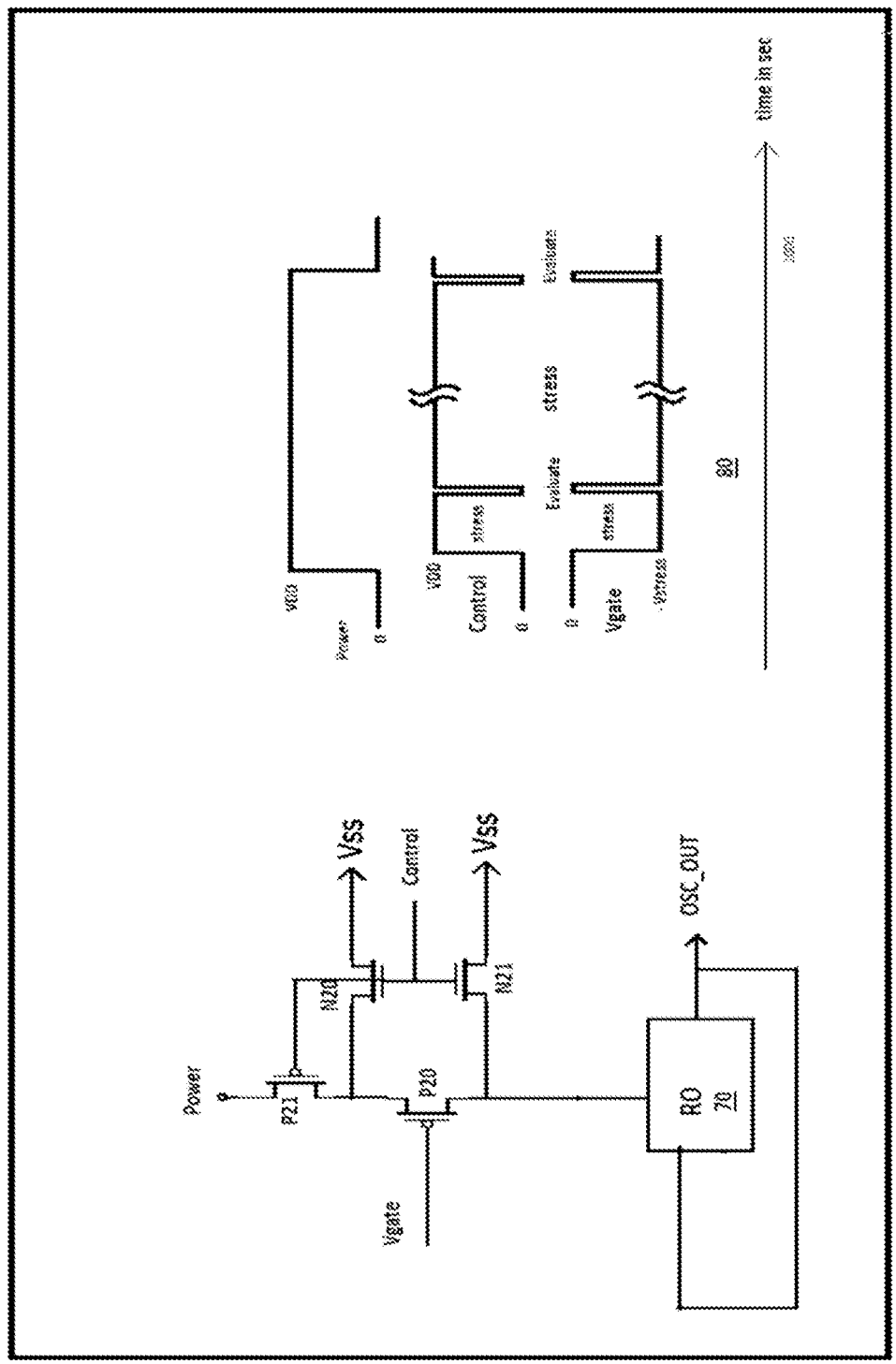
FIG. 3 is a circuit diagram of one embodiment of the test circuit.

FIG. 3 illustrates a circuit diagram one embodiment of circuit and the associated timing diagram. The "Control" signal ensures no power delivery to the ring oscillator 70 during the stress phase of the test sequence. It also ensures a zero voltage bias between the source and drain of the transistor under evaluation P20 during the stress phase through control transistors N20 and N21. The "Control" signal also ensures the delivery of power to the ring oscillator 70 through the P-transistor under evaluation P20 during the "evaluate" phase of the test sequence. The "Vgate" signal is the gate voltage applied the gate of the P-transistor under evaluation P20 in accordance with timing diagram 80.

The timing diagram 80 represents an embodiment of the signals "power", "Control", and "Vgate" to ensure pre and post stress evaluation of the P-transistor under evaluation 20, and no stress of ring oscillator 70 during the stress phase of the stress test.

Figure 4:
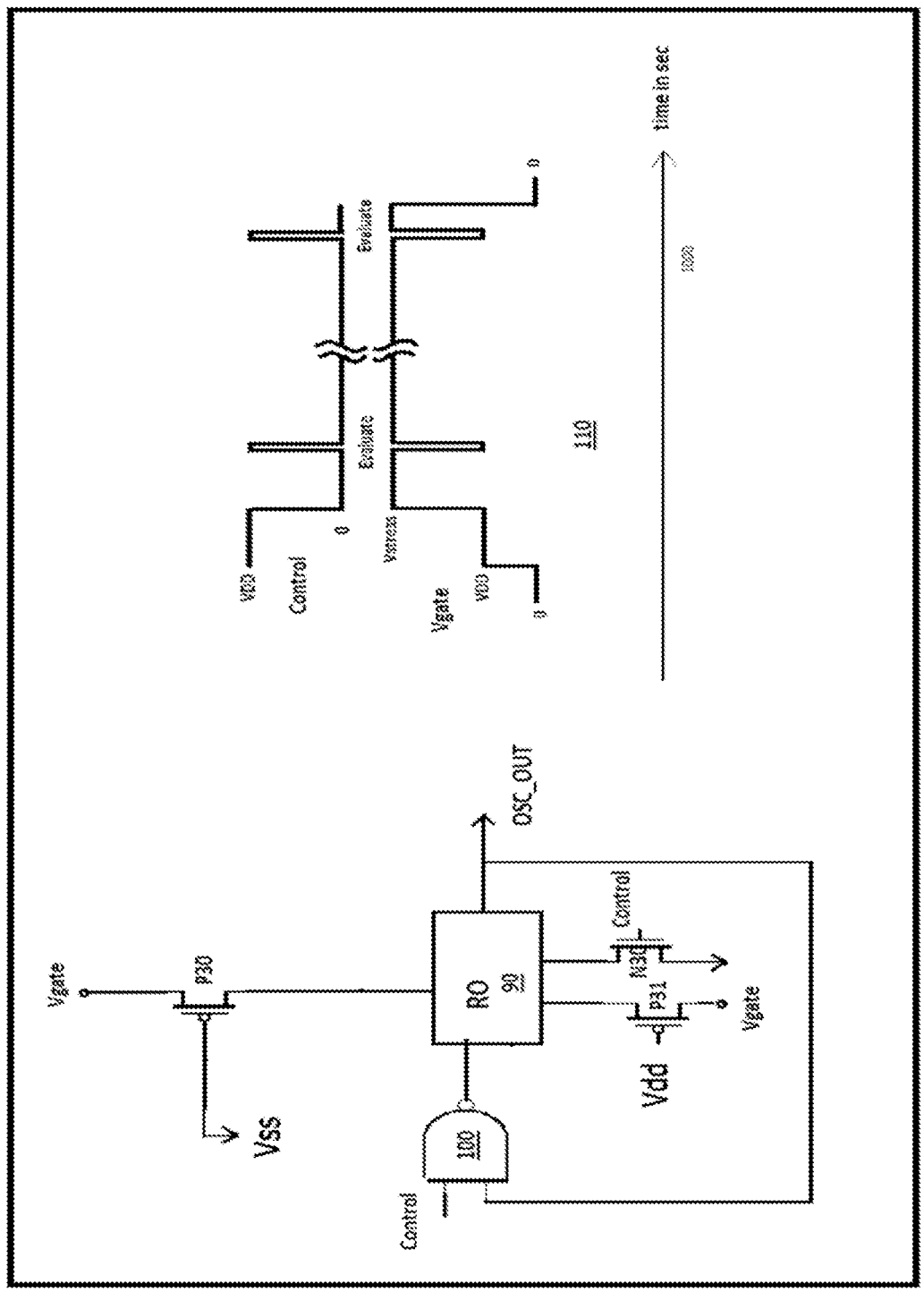
FIG. 4 is a circuit diagram of another embodiment of the test circuit.

Referring now to FIG. 4, another embodiment of a circuit diagram and associated signals is shown. The "Control" signal in conjunction with the "Vgate" signal ensures normal power delivery to the ring oscillator 90 during the evaluate phase of the test sequence through transistors P31 and N30. It also ensures, in conjunction with signal "Vgate," a zero Volt bias across the ring oscillator 90 during the stress phase. The "Vgate" signal here is the gate voltage of the P-transistor P30 under test, and of the associated circuitry transistor P31 in accordance with timing diagram 110. The timing diagram 110 represents an embodiment of the sequence of events of the signals "Control" and "Vgate" to ensure pre and post stress evaluation of the P-transistor 30 and of a no stress of RO 90 during the stress phase of the stress test.

Figure 5:
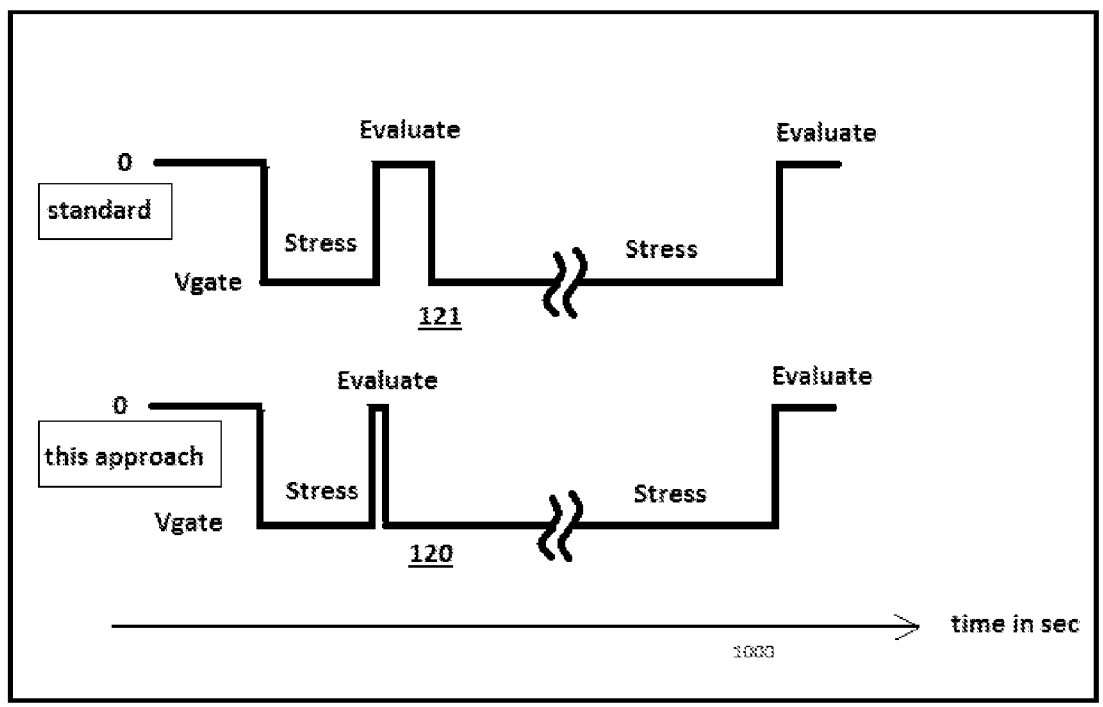
FIG. 5 is a timing diagram, showing one embodiment of prior-art test. timing and a test timing using the fast thermal instability circuit of the present invention.

Referring now to FIG. 5, two embodiments of the timing of the stress and evaluation cycle is shown. The timing diagram depicts alternating stress and evaluate cycles. During the evaluate cycle the P-transistor gate voltage assumes the value of zero, typical of normal operation of the P-transistor. The value of Vgate is lower than 0 during the stress phase of stress/evaluate cycles. In one embodiment, for NBTI testing, the typical value of Vgate is around −1.2V to −1.5V and a typical cumulative stress time is 1000 seconds with the stress/evaluate cycles typically conducted at a temperature of 125 degrees C. This is done to place a higher stress level on the P-device under test, to simulate longer-term use of the system.

Timing diagram 120, illustrating the embodiments described herein, shows a significantly shorter time for the evaluate cycle then the evaluate cycle length under the standard, or existing state of the art process 121. Because the NBTI can undergo a partial recovery during the evaluate cycle, a shorter evaluate cycle 120 translates to more accurate measurement, in addition to shortening the time spent on evaluation during the evaluation phase of the test sequence.

Figure 6:
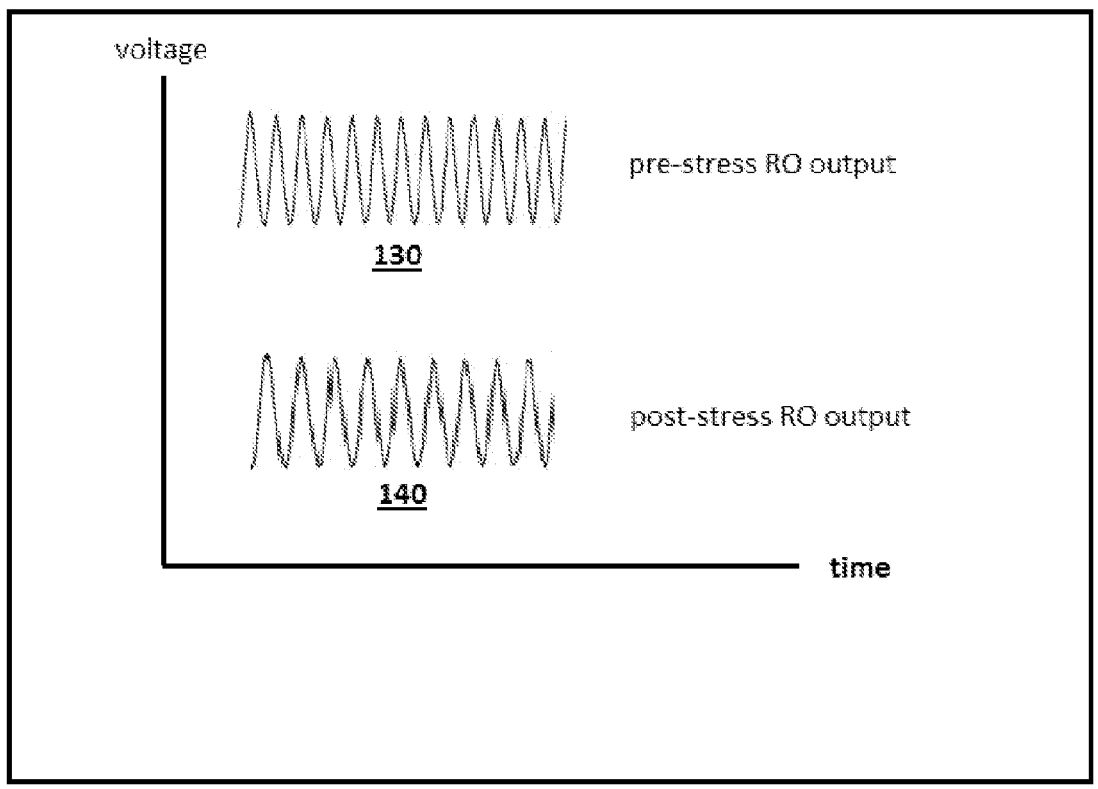
FIG. 6 is an exemplary output of a ring oscillator, showing the before stress and after stress test results.

Referring now to FIG. 6, a typical pre-stress oscillator output and post-stress oscillator output are shown. The pre-stress output 130 has a frequency proportional to the drive strength of the P-transistor under evaluation, which in turn is reflective of the P-transistor threshold voltage and saturation current. This can be compared to the post-stress oscillator output 140, with a frequency proportional to the drive strength of the P-transistor under evaluation after it has undergone stress, which in turn is reflective of the P-transistor threshold voltage and saturation current after stress. The ratio of the two frequencies of 130 and 140 is an indication of the amount of degradation the P-transistor has undergone. This can be used in EDA, design, and verification processes to ensure that the device will function properly after the P-transistor has been stressed by real use.

Figure 7:
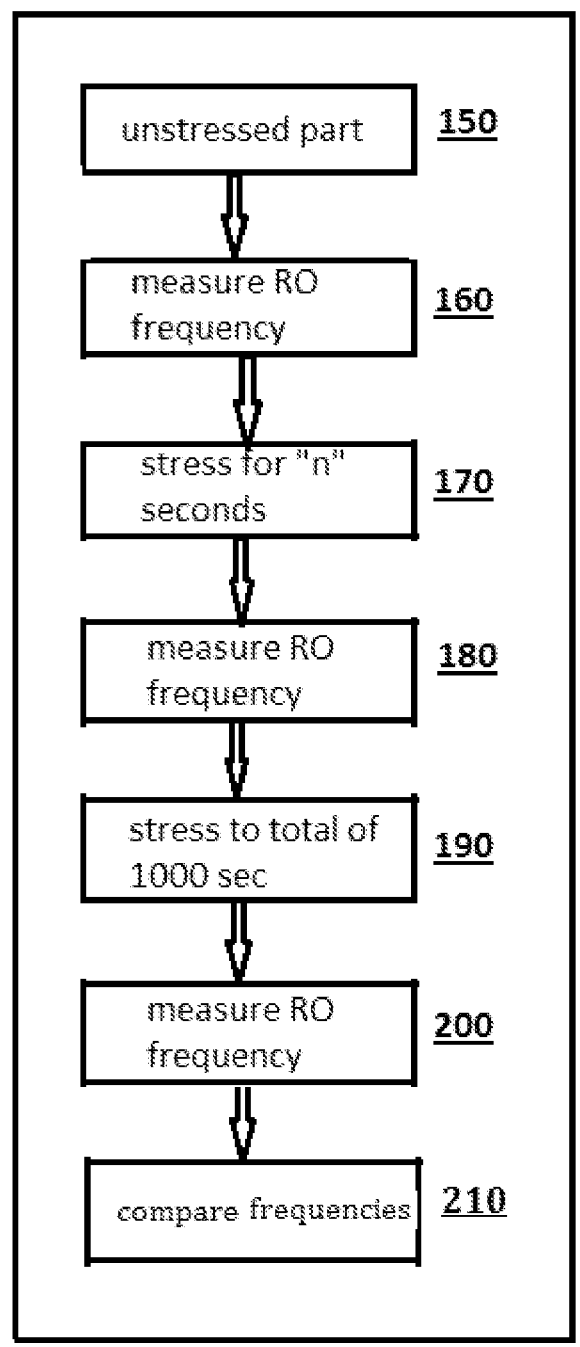
FIG. 7 is a flowchart of one embodiment of the testing cycle.

Referring now to FIG. 7, a representative flowchart of one embodiment of the stress/evaluate procedure is shown. In accordance with this flow, the procedure is initiated with a fresh unstressed P-transistor (block 150). With the fresh P-transistor in normal operating mode, representative of an initial unstressed evaluation phase, the ring oscillator output is measured and recorded (block 160). Then the P-transistor is subjected to stress for a specified number of seconds with the gate of the P-transistor at Vgate as per 121 representing a stress cycle (block 170). A first post-stress evaluate cycle is entered where the output frequency of the ring oscillator is measured and recorded (block 180). Another stress cycle is entered for typically a cumulative stress time of 1000 seconds (at block 190), followed by a final evaluation cycle for a final measurement and recording of the post-stress frequency of the ring oscillator (block 200).

This is one embodiment of the stress/evaluate flow for NBTI evaluation of a P-transistor. Steps 170 through 200 can be repeated for any desirable duration with intermediate measurements of post stress frequencies of the ring oscillator. In one embodiment, only a single stress cycle is used to evaluate the transistor. In another embodiment, more than two stress cycles are used. The number of stress cycles in the cumulative stress test may range from one to as many as hundreds. The more cycles are used, the more detailed the characterization of the P-transistor. Because there is no manual interaction needed, there is no significant disincentive to using more, shorter, stress cycles with a total cumulative stress test of a standard length (in one embodiment 1000 seconds).

The ring oscillator frequencies post-stress are then compared to the frequency measured from the unstressed part at block 160, to calculate the degradation of the transistor (block 210). This information is then added to the model of the transistor, which provides the timing, power requirements, and characteristics of the transistor. The collection of such device models may be referred to as a library. The model from the library can then be used in circuit designs using the P-type transistor, to ensure that the design takes into account the effect of stress.

One of ordinary skill in the art will recognize that the process is a conceptual representation of the operations used to stress test a transistor. The specific operations of the process may not be performed in the exact order shown and described. The specific operations may not be performed in one continuous series of operations, and different specific operations may be performed in different embodiments. Furthermore, the process could be implemented using several sub-processes, or as part of a larger macro process.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A circuit comprising:
   a transistor for testing, the transistor having a gate-to source voltage Vgs and a drain-to-source voltage Vds;
   a sensor circuit connected to the drain of the transistor;
   a complementary control circuitry attached to the transistor and the sensor circuit such that the sensor circuit is powered off during a stress test of the transistor, and the drain-to-source voltage of the transistor for testing is zero during the stress test, and the sensor circuit is powered through the transistor during an evaluation of the stress test, the complementary control circuit comprising a pair of transistors coupled to the sensor circuit in parallel, a first transistor to set a voltage across the sensor circuit to zero during the stress test, and a second transistor to provide ground during the stress test evaluation.

2. The circuit of claim 1, wherein the sensor circuit is a ring oscillator.

3. The circuit of claim 2, wherein the frequency output of the ring oscillator reflects a threshold voltage and a saturation current of the transistor.

4. The circuit of claim 1, where a test signal is coupled to the gate of the transistor.

5. The circuit of claim 1, wherein the stress phase of the test comprises setting the gate to source voltage Vgs in an "on" state at a higher voltage than normal operation.

6. The circuit of claim 1, wherein the evaluate phase of the test comprises setting the gate to source voltage Vgs in an "on" state at a voltage associated with normal operation.

7. The circuit of claim 1, wherein a plurality of stress tests are applied to the transistor for testing, and the control circuitry further for recording a post-stress result.

8. The circuit of claim 1, further comprising:
   a library to store characterization information for the transistor based on the output of the sensor circuit, the library used in circuit design.

9. A method comprising:
   performing a stress test of a transistor by applying a stress voltage Vg at a gate of the transistor and a voltage Vdd and a drain of the transistor;
   powering off a sensor circuit coupled to the transistor during the stress test of the transistor by setting a voltage across the sensor circuit to zero during the stress test using a first transistor and providing ground through a second transistor during the evaluation of the stress test;
   evaluating the transistor by measuring an output of the sensor circuit immediately upon releasing the stress test, the output of the sensor circuit measuring a degradation of the transistor due to the stress test.

10. The method of claim 9, wherein the sensor circuit is a ring oscillator.

11. The method of claim 10, wherein a frequency of the ring oscillator is representative of a threshold voltage and a saturation current of the transistor.

12. The method of claim 9, wherein the stress phase of the test comprises setting the gate to source voltage Vgs of the transistor in an "on" state at a higher voltage than normal operation.

13. The method of claim 9, wherein the evaluation comprises setting the gate to source voltage Vgs in an "on" state at a voltage associated with normal operation.

14. The method of claim 9, further comprising:
   calculating characterization information for the transistor based on the output of the sensor circuit;
   adding the characterization information for the transistor to a library, the library used in circuit design.

15. The method of claim 14, wherein the characterization is calculated after a plurality of stress tests.

16. A circuit comprising:
   a P-type transistor for testing, the transistor having a gate-to source voltage Vgs and a drain-to-source voltage Vds;
   a ring oscillator coupled to the drain of the transistor;
   a complementary control circuitry attached to the transistor and the sensor circuit, the complementary control circuit powering off the ring oscillator during a stress test of the transistor, and setting the Vds of the transistor, Vds is zero during the stress test, the complementary control circuit comprising a pair of transistors coupled to the ring oscillator in parallel, a first transistor to set a voltage across the ring oscillator to zero during the stress test, and a second transistor to provide ground during the stress test evaluation; and a tester to measure a frequency output of the ring oscillator to determine a threshold voltage and a saturation current of the transistor.

17. The circuit of claim 16, wherein the P-type transistor is first evaluated prior to the stress test.

18. The circuit of claim 17, wherein a change in the frequency output of the ring oscillator between the first evaluation prior to the stress test and the evaluation after the stress determine a level of degradation of the transistor.

* * * * *